(12) United States Patent
Jiang et al.

(10) Patent No.: US 8,973,378 B2
(45) Date of Patent: Mar. 10, 2015

(54) SYSTEM AND METHOD FOR REMOVING HEAT GENERATED BY A HEAT SINK OF MAGNETIC RESONANCE IMAGING SYSTEM

(75) Inventors: Longzhi Jiang, Florence, SC (US); Jalal Zia, Florence, SC (US); John Scaturro, Jr., Florence, SC (US); William Einziger, Florence, SC (US)

(73) Assignee: General Electric Company, Schenectady, NY (US)

( * ) Notice: Subject to any disclaimer, the term of this patent is extended or adjusted under 35 U.S.C. 154(b) by 1100 days.

(21) Appl. No.: 12/775,199

(22) Filed: May 6, 2010

(65) Prior Publication Data
US 2011/0271693 A1 Nov. 10, 2011

(51) Int. Cl.
*F17C 5/02* (2006.01)
*F25B 19/00* (2006.01)
*F25B 9/00* (2006.01)
*F25D 19/00* (2006.01)
*F17C 13/00* (2006.01)
*F17C 3/08* (2006.01)
*G01R 33/38* (2006.01)
*F25B 9/10* (2006.01)
(Continued)

(52) U.S. Cl.
CPC ............ F25D 19/006 (2013.01); F17C 13/007 (2013.01); F17C 3/085 (2013.01); G01R 33/3804 (2013.01); *F25B 2400/17* (2013.01); *F25B 9/10* (2013.01); *F25B 9/14* (2013.01); *F17C 2221/017* (2013.01); *F17C 2265/034* (2013.01); *G01R 33/3815* (2013.01); *H01F 6/04* (2013.01); *F25B 2500/06* (2013.01)

USPC .................... 62/51.1; 62/47.1; 62/6; 62/51.2; 62/610; 335/216

(58) Field of Classification Search
CPC .. G01R 33/3804; G01R 33/3815; F25B 9/10; F25B 9/14; F25B 2400/17; F25D 19/00; F25D 19/006; H01F 6/04; F17C 2221/017; F17C 2265/033
USPC ............. 62/47.1, 48.1, 48.2, 48.3, 51.1, 51.2, 62/610, 6
See application file for complete search history.

(56) References Cited

U.S. PATENT DOCUMENTS 3,705,498 A * 12/1972 DeHaan .......................... 62/47.1
4,926,646 A * 5/1990 Dorri et al. ..................... 62/51.1
(Continued)

FOREIGN PATENT DOCUMENTS

GB 2414536 A 11/2005

OTHER PUBLICATIONS

Search Report issued in connection with corresponding GB Application No. 1107202.2 dated Aug. 31, 2011.

*Primary Examiner* — Frantz Jules
*Assistant Examiner* — Keith Raymond
(74) *Attorney, Agent, or Firm* — The Small Patent Law Group LLC; Dean Small

(57) ABSTRACT

Systems and methods from removing heat generated by a heat sink of a magnetic resonance imaging (MRI) system are provided. One system includes a coldhead sleeve cooling arrangement for a coldhead of the MRI system. The coldhead sleeve cooling arrangement includes a coldhead sleeve configured to receive therein a coldhead of an MRI system and a cooling system surrounding an outer surface of the coldhead sleeve. The cooling system uses helium gas to remove heat from the coldhead sleeve.

17 Claims, 5 Drawing Sheets

(51) Int. Cl.
*F25B 9/14* (2006.01)
*G01R 33/3815* (2006.01)
*H01F 6/04* (2006.01)

(56) References Cited

U.S. PATENT DOCUMENTS

| | | | | |
|---|---|---|---|---|
| 5,265,430 A | * | 11/1993 | Chen et al. | 62/48.1 |
| 5,339,650 A | * | 8/1994 | Hakamada et al. | 62/51.1 |
| 5,381,666 A | * | 1/1995 | Saho et al. | 62/47.1 |
| 5,613,367 A | * | 3/1997 | Chen | 62/47.1 |
| 5,657,634 A | * | 8/1997 | Woods | 62/51.1 |
| 5,782,095 A | * | 7/1998 | Chen | 62/47.1 |
| 7,170,377 B2 | | 1/2007 | Jiang et al. | |
| 7,497,084 B2 | * | 3/2009 | Xu et al. | 62/6 |
| 2006/0022779 A1 | | 2/2006 | Jiang et al. | |
| 2007/0101742 A1 | * | 5/2007 | Laskaris et al. | 62/259.2 |
| 2007/0214802 A1 | * | 9/2007 | Nemoto et al. | 62/47.1 |
| 2008/0155995 A1 | * | 7/2008 | Hughes et al. | 62/48.3 |
| 2009/0094992 A1 | * | 4/2009 | Wang | 62/6 |

\* cited by examiner

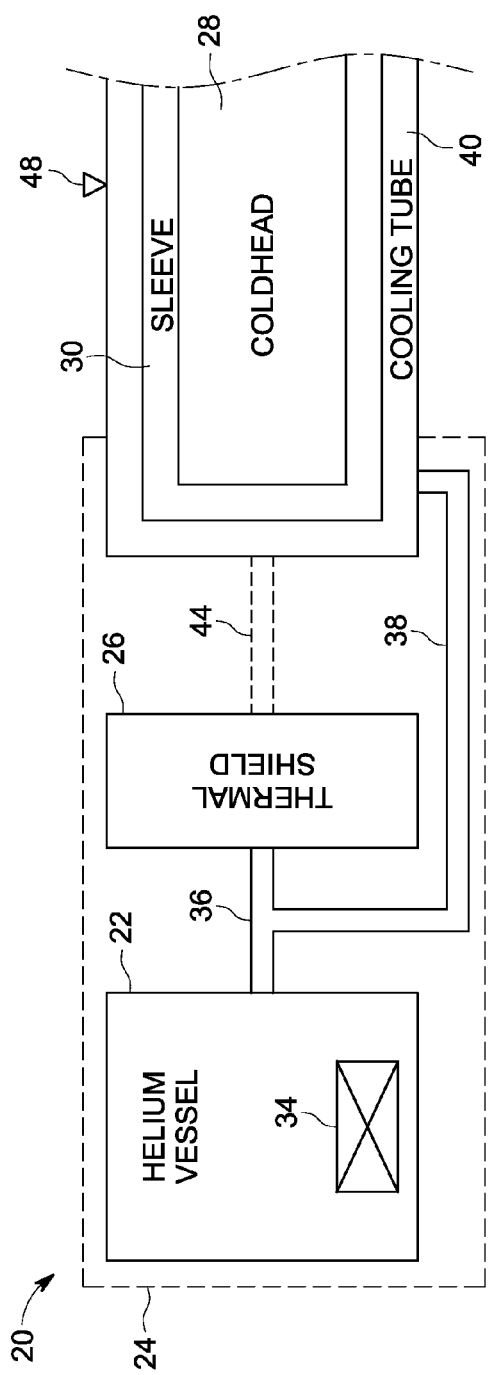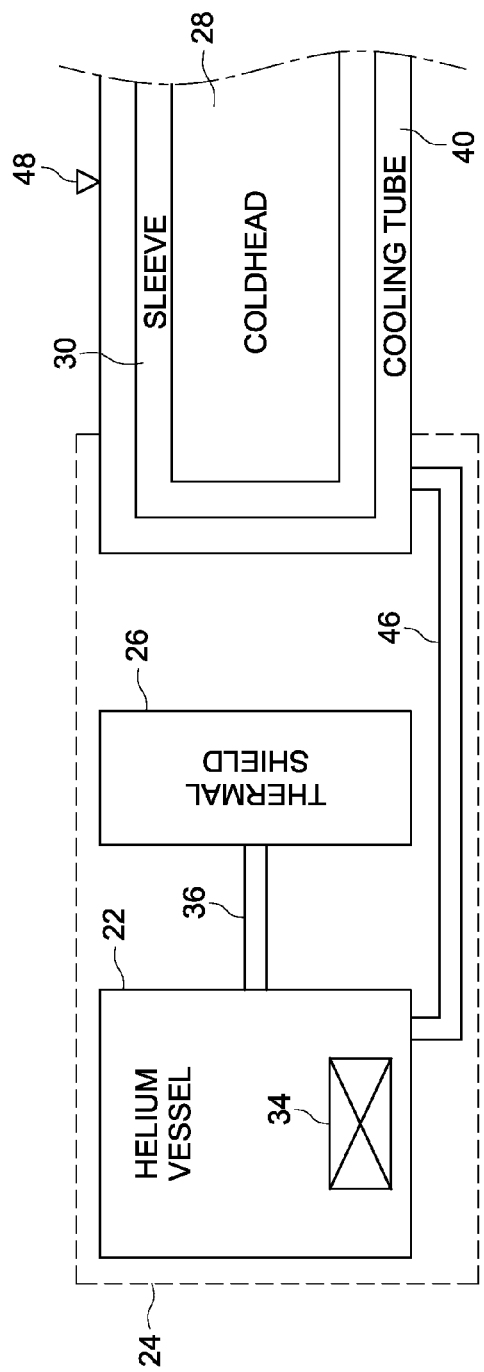

SYSTEM AND METHOD FOR REMOVING HEAT GENERATED BY A HEAT SINK OF MAGNETIC RESONANCE IMAGING SYSTEM

BACKGROUND OF THE INVENTION

The subject matter disclosed herein relates generally to cryogenically cooled magnetic resonance imaging (MRI) systems, and more particularly to systems and methods for removing heat from heat sinks of the MRI systems.

In superconducting coil MRI systems, the coils forming the superconducting magnets are cryogenically cooled using a helium vessel. The cryogen cooling system of some of these MRI systems include a coldhead within a coldhead sleeve that operates to recondense vaporized cryogen to continually cool the superconducting magnet coils during system operation.

When the coldhead is off, for example, during transportation of the MRI system, power off of the MRI system during normal operation, or coldhead failure, the coldhead sleeve is heated due to contact between the coldhead and the coldhead sleeve. During this time, the coldhead sleeve acts like a heat sink (or heat source) and applies heat to the MRI system, including to a thermal shield and the helium vessel of the MRI system. In this condition with the coldhead sleeve acting like a heat sink and heating up the thermal shield and helium vessel, helium inside the helium vessel boils off. Thus, helium from the helium vessel is lost and must be replaced, which results in added cost and system maintenance.

BRIEF DESCRIPTION OF THE INVENTION

In accordance with various embodiments, a coldhead sleeve cooling arrangement for a coldhead of a magnetic resonance imaging (MRI) system is provided. The coldhead sleeve cooling arrangement includes a coldhead sleeve configured to receive therein a coldhead of an MRI system and a cooling system surrounding an outer surface of the coldhead sleeve. The cooling system uses helium gas to remove heat from the coldhead sleeve.

In accordance with other embodiments, a magnetic resonance imaging (MRI) magnet system is provided that includes a vessel having liquid helium therein and a superconducting magnet within the vessel. The MRI magnet system further includes a coldhead sleeve configured to receive a coldhead for cooling the superconducting magnet and a cooling tube surrounding at least a portion of the coldhead sleeve and connected to the vessel with a gas passageway.

In accordance with yet other embodiments, a method for cooling a coldhead sleeve of a magnetic resonance imaging (MRI) magnet system is provided. The method includes transferring exhaust helium gas from a helium vessel of the MRI magnet system to the coldhead sleeve and circulating the helium gas around an outside surface of the coldhead sleeve. The method further includes removing heat from the coldhead sleeve using the circulated helium gas.

BRIEF DESCRIPTION OF THE DRAWINGS

FIG. 1 is a simplified block diagram of magnetic resonance imaging (MRI) magnet system illustrating a cooling arrangement formed in accordance with an embodiment.

FIG. 2 is a simplified block diagram of magnetic resonance imaging (MRI) magnet system illustrating a cooling arrangement formed in accordance with another embodiment.

DETAILED DESCRIPTION OF THE INVENTION

Figure 3:
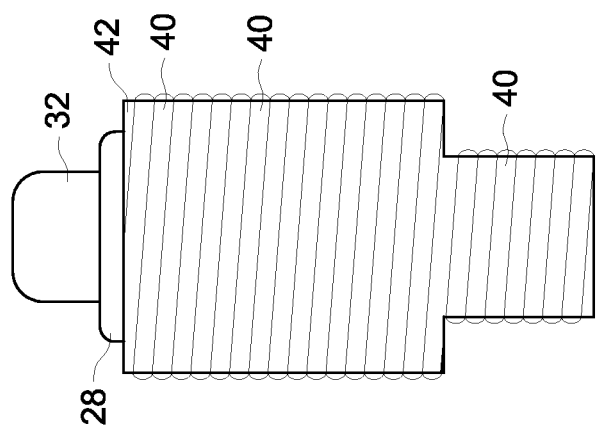
FIG. 3 is a side elevation view illustrating a cooling tube formed in accordance with various embodiments in combination with a coldhead sleeve.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for removing heat and/or cooling down the coldhead sleeve of a magnetic resonance imaging (MRI) system during power off conditions, such as during MRI system transportation, power off during normal operation or coldhead failure. The various embodiments utilize the exhaust helium gas to remove heat from and cool down the coldhead sleeve. By practicing at least one embodiment, the heat to a thermal shield and helium vessel of the MM system is reduced during power off conditions, which can result in reduced helium consumption.

FIGS. 1 and 2 illustrate embodiments wherein cooling of the coldhead sleeve is provided during power off conditions, particularly power off conditions of the coldhead. Specifically, FIGS. 1 and 2 are simplified block diagrams illustrating an MRI magnet system 20, which includes one or more superconducting magnets. It should be noted that like numerals represent like parts in FIGS. 1 and 2. The MRI magnet system 20 includes a vessel 22 that holds a liquid cryogen, such as liquid helium. Thus, in this embodiment, the vessel 22 is a helium vessel, which also may be referred to as a helium pressure vessel. The vessel 22 is surrounded by a vacuum vessel 24 and includes a thermal shield 26 therein and/or therebetween. The thermal shield 26 may be, for example, a thermally isolating radiation shield. A coldhead 28, which in various embodiments is a cryocooler, extends through the vacuum vessel 24 within a coldhead sleeve 30 (e.g., a housing). Thus, the cold end of the coldhead 28 may be positioned within the coldhead sleeve 30 without affecting the vacuum within the vacuum vessel 24. The coldhead 28 is inserted and secured within the coldhead sleeve 30 using any suitable means, such as one or more flanges and bolts, or other means known in the art. Moreover, a motor 32 (shown in FIG. 3) of the coldhead 28 is provided outside the vacuum vessel 24.

A magnet 34, which in various embodiments is a superconducting magnet, is provided inside the helium vessel 22 and is controlled during operation of the MM system as described in more detail herein to acquire MM image data. Additionally, during operation of the MRI system, liquid helium within the helium vessel 22 of the MRI magnet system 20 cools the superconducting magnet 34, which may be configured as a coil assembly as is known. The superconducting magnet 34 is cooled to a superconducting temperature, for example, 4.2 Kelvin (K). The cooling process may include the recondensing of boiled off helium gas to liquid by a helium recondensing system (not shown) and returned to the helium vessel 22. It should be noted that the boiled off helium may pass through a gas passageway 36 that connects the helium vessel 22 to the thermal shield 26. In some embodiments, the thermal shield 26 may be surrounded by a cooling tube (not shown), which is connected to the gas passageway 36. The passage of the helium gas through the cooling tube from the gas passageway 36 acts to cool the thermal shield 26.

In various embodiments, a cooling system or arrangement is also provided that cools the coldhead sleeve 30 during power off conditions of the coldhead 28. The cooling system includes a gas passageway 38 that connects the helium vessel 22 to a cooling member provided in combination with the coldhead sleeve 30, which is illustrated as a cooling tube 40 for cooling the coldhead sleeve 30, particularly during a power off condition of the coldhead 28. The gas passageway 38 operates to circulate exhaust helium gas that boils off from the helium vessel 22 to cool or remove heat from the coldhead sleeve 30, which also reduces the heat to the thermal shield 26 and helium vessel 22, which are both within the vacuum vessel 24. The cooling tube 40 in some embodiments substantially surrounds (and is in thermal contact with) an outer surface 42 (shown in FIG. 3) of the coldhead sleeve 30.

In one embodiment, as illustrated in FIG. 1, the gas passageway 38 is connected to or forms part of the gas passageway 36 connecting the helium vessel 22 to the thermal shield 26. For example, the gas passageway 38 may form a branch off of the gas passageway 36. In the embodiment of FIG. 1, a gas passageway 44 optionally or additionally may be connected from the cooling tube (not shown) of the thermal shield 26 to the cooling tube 40 of the coldhead sleeve 30.

In another embodiment, as illustrated in FIG. 2, a gas passageway 46 connects the helium vessel 22 to the cooling tube 40 with a separate connection, namely the gas passageway 36 connecting the helium vessel 22 to the thermal shield 26. Thus, in this embodiment, the gas passageway 46 is separate from the gas passageway 36. Accordingly, gas may pass through the gas passageway 36 and gas passageway 46 at different times, for example, based on a pressure level of the boiled off helium gas from the helium vessel 22 or a current operating condition, or may pass through the gas passageway 36 and gas passageway 46 concurrently. Thus, different coldhead sleeve cooling arrangements or configurations may be provided.

In the various embodiments, for example as illustrated in FIGS. 1 and 2, the gas passageway 38 and gas passageway 46, respectively, operate to transfer or communicate helium gas from the helium vessel 22 to circulate boiled off helium gas from the helium vessel 22 during a power off condition of the coldhead 28. It should be noted that any coupling arrangement or means for transferring the boiled off helium from the helium vessel 22 to the cooling tube 40 may be used. For example, in some embodiments, the gas passageway 36 and/or gas passageway 46 may be part of or extensions of the cooling tube 40.

Thus, the gas passageway 36 and gas passageway 46 act as a conduit for exhaust helium gas that is used during coldhead power off conditions to cool or remove heat from the coldhead 28. In accordance with various embodiments, a thermal equilibrium is applied using the gas passageway 36 or gas passageway 46. For example, the extra heat to the thermal shield 26 during coldhead power off conditions may be about 20 watts (W). When the boil-off rate of the helium from the helium vessel 22 is about 5 liters/hour, the heat removal by the exhaust gas from the helium vessel 22 that passes through the gas passageway 36 and gas passageway 46 is about 55 W. This heat removal of 55 W, thus, balances 35 W+20 W from the coldhead power off condition. Accordingly, in various embodiments the boiled off helium gas (exhaust helium gas) is diverted or transferred through the gas passageway 36 and/or gas passageway 46 to cool down and/or remove heat from the coldhead 28, as well as optionally the thermal shield 26, which reduces the boil off.

It should be noted that a pressure relief valve 48 also may be provided in connection with the cooling tube 40. The pressure relief valve 48 operates to release exhaust helium gas outside the vacuum vessel 24 and/or into the atmosphere, such as when the pressure within the MRI magnet system 20 (e.g., pressure within the helium vessel 22) reaches a predetermined maximum level, which may be determined by the maximum operating pressure of the relief valve 48.

In some embodiments, the cooling tube 40 substantially surrounds (and is in thermal contact with) the outer surface 42 of the coldhead sleeve 30 as shown in FIG. 3 It should be noted that the outline profile of the outer surface 42 is shown for illustration and is substantially covered by the cooling tube 40.

The cooling tube 40 in various embodiments is spiral wound around the coldhead sleeve 30, which may extend along the entire axial length (or a portion thereof) of the outer surface 42 of the coldhead sleeve 30. Each turn of the cooling tube 40 may abut a previous turn of tubing such that no gap or minimal gap exists between successive windings or turns of the cooling tube 40 around the coldhead sleeve 30. In various embodiments, the size, shape and configuration of the cooling tube 40 are provided to maximize contact with the coldhead sleeve 30, and more particularly, the outer surface 42. The cooling tube 40 in various embodiments is coupled to or supported on the outer surface 42 of the coldhead sleeve 30 in a configuration that is based on the amount of thermal contact and/or the area of contact with the outer surface 42. For example, in various embodiments the amount of outer surface 42 not encompassed by the cooling tube 40 is minimized or reduced.

It should be noted that the cooling tube 40 may be coupled to the outer surface 42 of the coldhead sleeve 30 using any suitable securing means or fastener. For example, the cooling tube 40 may be coupled to the outer surface 42 of the coldhead sleeve 30 using (i) a mechanical fastener, such as a clamp, ring, etc. or (ii) a non-mechanical fastener, such as solder, epoxy, thermal paste, etc. It also should be noted that although the cooling tube 40 is illustrated as spiral wound around the coldhead sleeve 30, different configurations or arrangements may be used. For example, the cooling tube 40 may be coupled to the coldhead sleeve 30 in a serpentine, zig-zag or other configuration, which may include a single tube, multiple interconnected tubes or multiple interconnected tube sections. It further should be noted that the cooling arrangement of the various embodiments is not limited to a cooling tube 40 and may be provided using any means capable of circulating helium gas.

Figure 4:
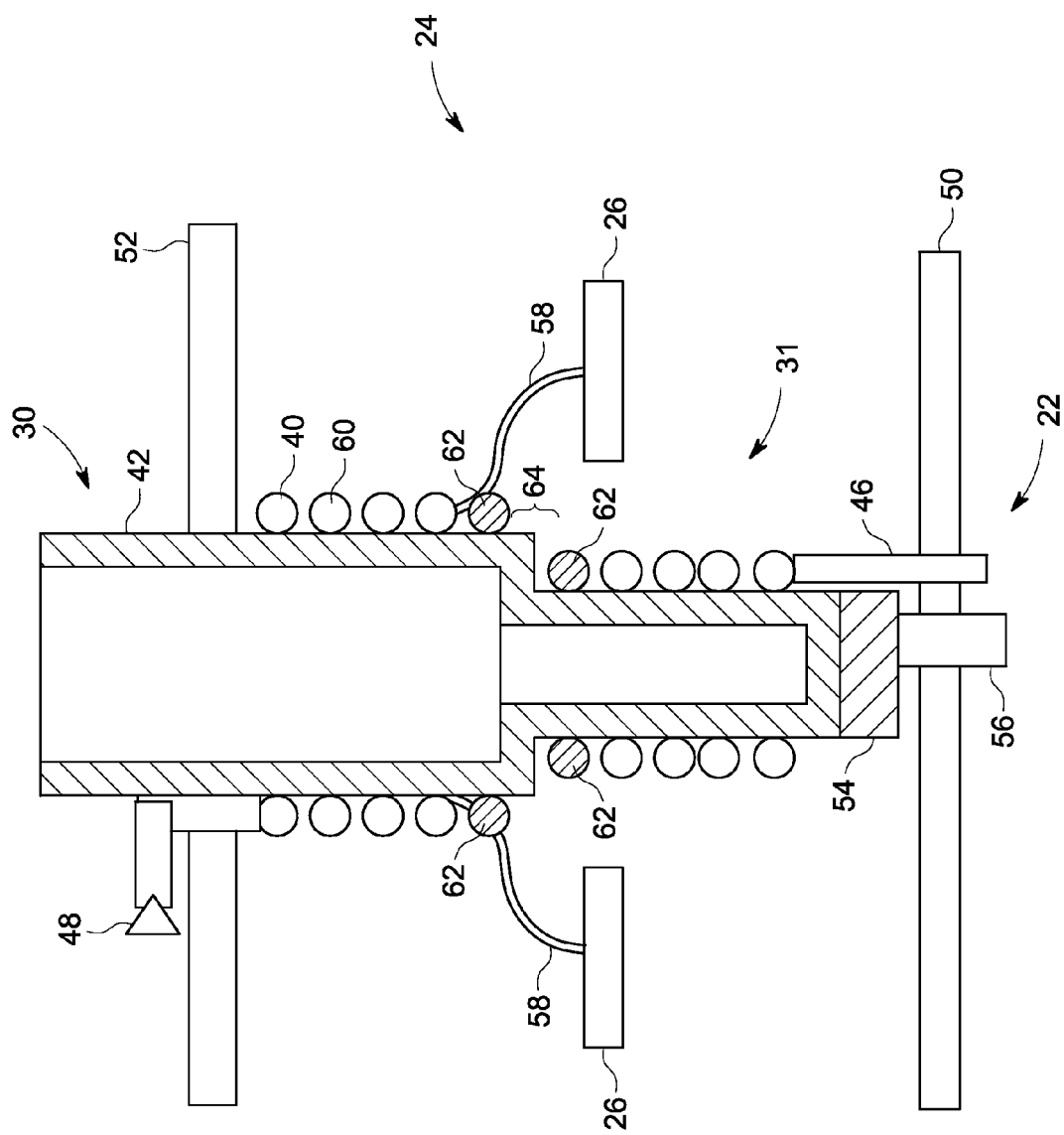
FIG. 4 is a cross-sectional view illustrating a coldhead sleeve having a cooling tube formed in accordance with various embodiments.

FIG. 4 is a simplified cross-sectional view of a coldhead sleeve 30 having a coldhead sleeve cooling arrangement 31 including the cooling tube 40 formed in accordance with various embodiments. FIG. 4 illustrates a portion of the MRI magnet system 20, wherein a portion of a wall 50 of helium vessel 22 and a portion of a wall 52 of the vacuum vessel 24 are shown. Additionally, a recondensor 54 is shown that recondenses boiled off helium gas from the helium vessel 22 as described in more detail herein. The recondensor 54 is coupled to the helium vessel 22 via one or more passageways 56. For example, one passageway may be provided from the helium vessel 22 to the recondensor 54 for transferring boiled off helium gas and another passageway may be provided from the recondensor 54 to the helium vessel 22 for transferring back recondensed helium liquid.

It should be noted that a thermal link 58 between the coldhead sleeve 30 and the thermal shield 26 is represented by a pair of lines connecting the coldhead sleeve 30 and thermal shield 26. The thermal link 58 merely illustrates that thermal conduction exists between the thermal shield 26 and the coldhead sleeve 30. It also should be noted that a cooling tube (not shown) may be provided in combination with the thermal shield 26, for example, surrounding the thermal shield 26.

The cooling tube 40 of the coldhead sleeve 30 is illustrated having a generally circular cross-section. However, different shaped cross-sections for the cooling tube 40 are contemplated and may be used. For example, the cooling tube 40 may have a flatted circle (two planar sides), substantially square (or square), substantially rectangular (or rectangular), substantially oval (or oval) or other cross-sectional shape. The shape and configuration of the cooling tube 40 is provided such that thermal contact with the outer surface 42 of the coldhead sleeve 30 is maximized, which is illustrated, for example, at point 60 along the outer surface 42.

In the illustrated embodiment, the cooling tube 40 extends along a length of the outer surface 42 of the coldhead sleeve 30 from a bottom end of the coldhead sleeve 30 to a point that is adjacent to or abuts the wall 52 of the vacuum vessel 24. Thus, the cooling tube 40 in this embodiment does not extend outside the vacuum vessel 24 into the atmosphere.

In various embodiments, the cooling tube 40 may be formed from different materials and/or tubing. For example, in some embodiments, the cooling tube 40 is formed from a metal material, such as copper or aluminum. In general, the cooling tube 40 is formed from a high thermal conductivity material.

The cooling tube 40 also may have any cross-sectional size (i.e., across the diameter of the cooling tube 40). In some embodiments, the cooling tube 40 has a diameter of between about 7 millimeters (mm) and 10 mm. However, other smaller or larger diameter sized cooling tubes 40 may be used. The diameter of the cooling tube 40 may be selected to maximize the thermal contact between the cooling tube 40 and the outer surface 42 of the coldhead sleeve 30. For example, based on the length of the portion of the coldhead sleeve 30 to be encompassed and the number of turns around the outer surface 42, the diameter of the cooling tube 40 may be selected such that substantially all of the outer surface 42 of the coldhead sleeve 30 is encompassed by and in thermal contact with the cooling tube 40.

It should be noted that when reference is made herein to thermal contact, this refers generally to two components that can exchange energy through the process of heat. For example, the cooling tube 40 is in thermal contact with the outer surface 42 of the coldhead sleeve 30 such that heat can be thermally conducted.

In some embodiments, in a region 64 wherein the diameter of the coldhead sleeve 30 changes, a transition tube 62, which may form part of or be connected to the cooling tube 40 optionally may be provided. The transition tube 62 includes tubing that is generally less conductive than the cooling tube 40. For example, the transition tube 62 may be formed from stainless steel. The transition tube 62 is configured and formed to reduce the likelihood or prevent a thermal short between the two different diameter sections, which also may be referred to as first and second stages of the coldhead sleeve 30. It also should be noted that in the region 64, the transition tube 62 may be configured or arranged differently (e.g. spiral wound in a different direction) to provide thermal contact with substantially all of the outer surface 42 of the coldhead sleeve 30.

Thus, in accordance with various embodiments, boiled off or exhaust helium from the helium vessel, particularly helium gas resulting from a power off condition of the coldhead, is used to cool down and/or remove heat from the coldhead sleeve, which reduces heat to the thermal shield and helium vessel. By circulating the helium gas through a cooling arrangement that may include tubing that surrounds the coldhead sleeve, heat from the coldhead sleeve is reduced or removed. The exhaust helium gas then may be released through the pressure relief valve. Thus, exhaust helium gas transferred from inside the helium vessel to outside the vacuum vessel is used to remove heat or cool the coldhead sleeve. In some embodiments, the helium gas circulated within the cooling tube may be recondensed.

Figure 5:
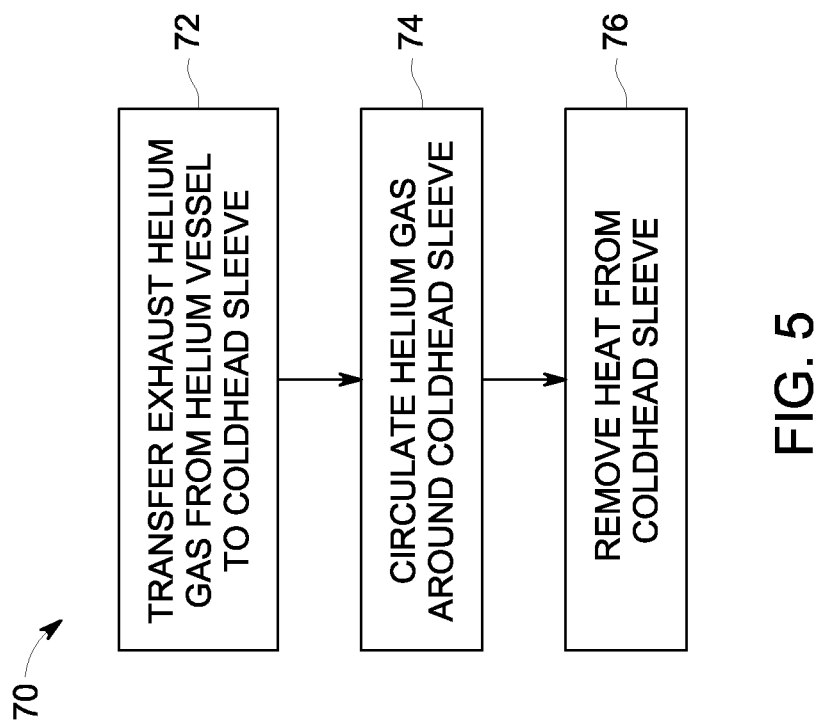
FIG. 5 is a flowchart of a method for cooling a coldhead sleeve in accordance with various embodiments.

A method 70 for cooling a coldhead sleeve, such as during power off or failure of the coldhead is also provided and shown in FIG. 5. The method 70 includes transferring exhaust helium gas, such as from boil off, from a helium vessel to a coldhead sleeve at 72. For example, one or more gas passageways may be used to transfer the helium gas, such as during a power off condition of the coldhead. The gas passageway may connect the helium vessel to a cooling tube surrounding the coldhead sleeve such that the helium gas is circulated around an outside surface of the coldhead sleeve at 74. Heat is then removed from the coldhead sleeve at 76, for example, by transferring the helium gas outside the vacuum vessel. The removed heat also can reduce the heat to the thermal shield and helium vessel of the MRI magnet system.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

Thus, the various embodiments may be implemented in connection with different types of superconducting coils, such as superconducting coils for an MRI system. For example, the various embodiments may be implemented with superconducting coils for use with the MRI system 100 shown in FIG. 6. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 6:
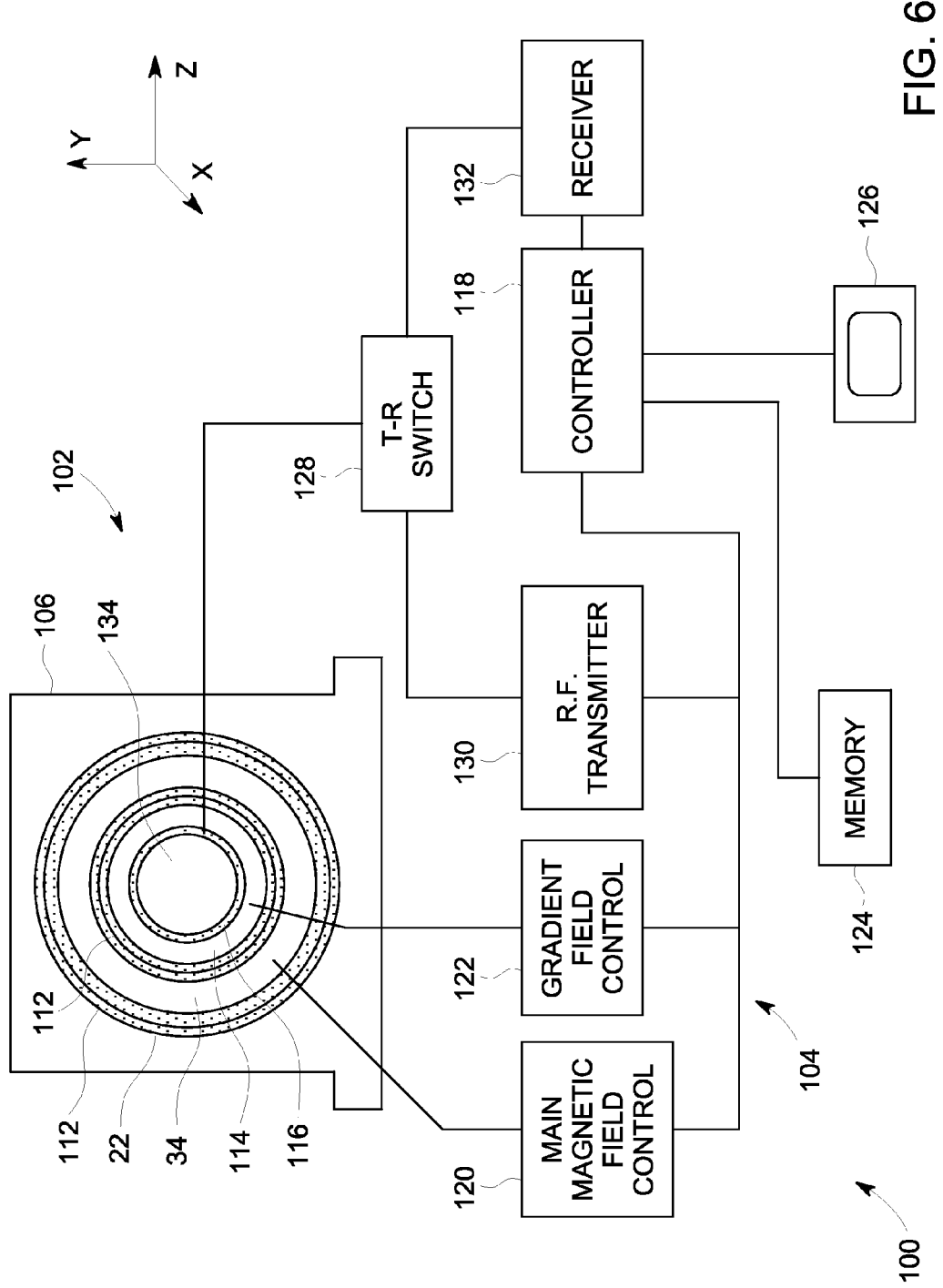
FIG. 6 is a pictorial view of an MRI system in which a coldhead sleeve with a cooling system formed in accordance with various embodiments may be implemented.

Referring to FIG. 6, the MRI system 100 generally includes an imaging portion 102 and a processing portion 104 that may include a processor or other computing or controller device. The MRI system 100 includes within a gantry 106 a superconducting magnet 34 formed from coils, which may be also supported on a magnet coil support structure. The helium vessel 22 (also referred to as a cryostat) surrounds the superconducting magnet 34 and is filled with liquid helium. The liquid helium may be used to cool a coldhead sleeve and/or a thermal shield as described in more detail herein.

Thermal insulation 112 is provided surrounding the outer surface of the helium vessel 22 and the inner surface of the superconducting magnet 34. A plurality of magnetic gradient coils 114 are provided inside the superconducting magnet 34 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 34 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 34 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 34.

The magnetic gradient coils 114, which include one or more gradient coil elements, are provided so that a magnetic gradient can be imposed on the magnetic field $B_o$ in the bore 134 within the superconducting magnet 34 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A coldhead sleeve cooling arrangement for a coldhead of a magnetic resonance imaging (MRI) system, the coldhead sleeve cooling arrangement comprising:
    a coldhead sleeve configured to receive therein a coldhead of art MRI system;
    a recondensor coupled to a vessel; and
    a cooling system surrounding and extending along substantially an entirety of an axial length of an outer surface of the coldhead sleeve, the cooling system using helium gas to remove heat from the coldhead sleeve, wherein the cooling system comprises a cooling tube, wherein the cooling tube is spiral wound around and in contact with the outer surface of the coldhead sleeve and includes a plurality of spiral turns, the plurality of spiral turns of the cooling tube abutting one another, the cooling tube connected to the vessel with a first gas passageway and connected to the recondensor with a second gas passageway, wherein helium gas from the vessel for recondensing is directed to the recondensor by the first and second gas passageways connecting the vessel and the recondensor.

2. A coldhead sleeve cooling arrangement in accordance with claim 1 wherein the cooling tube has one of a substantially circular cross-section, square cross-section, rectangular cross-section or oval cross-section.

3. A coldhead sleeve cooling arrangement in accordance with claim 1 wherein the cooling tube includes a transition tube having a thermal conductivity less than a thermal conductivity of the cooling tube.

4. A coldhead sleeve cooling arrangement in accordance with claim 1 wherein the cooling tube is connected to a helium vessel of the MRI system.

5. A coldhead sleeve cooling arrangement in accordance with claim 4 further comprising a gas passageway connecting the helium vessel to the cooling tube.

6. A coldhead sleeve cooling arrangement in accordance with claim 5 wherein the first gas passageway extends from the helium vessel to outside a vacuum vessel of the MRI system.

7. A coldhead sleeve cooling arrangement in accordance with claim 1 wherein the cooling system is configured to receive boiled off helium from the MRI system during a power off condition of the coldhead.

8. A coldhead sleeve cooling arrangement in accordance with claim 1 further comprising a pressure relief valve connected to the cooling system.

9. A coldhead sleeve cooling arrangement in accordance with claim 1 wherein the MR1 system is a superconducting magnet MRI system.

10. A coldhead sleeve cooling arrangement for a coldhead of a magnetic resonance imaging (MRI) system, the coldhead sleeve cooling arrangement comprising:
    a coldhead sleeve configured to receive therein a coldhead of an MRI system;
    a cooling system surrounding and extending along substantially an entirety of an axial length of an outer surface of the coldhead sleeve, the cooling system using helium gas to remove heat from the coldhead sleeve, wherein the cooling system comprises a cooling tube, wherein the cooling tube is connected to a helium vessel of the MRI system;
    a recondensor coupled to the helium vessel;
    a first gas passageway connecting the helium vessel to the cooling tube;
    a second gas passageway connecting the recondensor to the cooling tube, wherein helium gas from the helium vessel for recondensing is directed to the recondensor by the first and second gas passageways; and
    a thermal shield between the helium vessel and a vacuum vessel, and wherein the gas passageway connects the helium vessel to the thermal shield, wherein the cooling tube extends from a bottom end of the coldhead sleeve to a wall of the vacuum vessel.

11. A magnetic resonance imaging (MRI) magnet system comprising:
    a vessel having liquid helium therein;
    a superconducting magnet within the vessel;
    a coldhead sleeve configured to receive a coidhead for cooling the superconducting magnet;
    a recondensor coupled to the vessel; and
    a cooling tube surrounding and extending along substantially an entirety of an axial length of the coldhead sleeve, the cooling tube connected to the vessel with a first gas passageway and connected to the recondensor with a second gas passageway, wherein helium gas from the vessel for recondensing is directed to the recondensor by the first and second gas passageways connecting the vessel and the recondensor.

12. An MRI magnet system in accordance with claim 11 further comprising a thermal shield and wherein the first gas passageway connects the vessel to the thermal shield.

13. An MRI magnet system in accordance with claim 11 wherein the first gas passageway extends from the vessel to outside a vacuum vessel.

14. An MRI magnet system in accordance with claim 11 wherein the coldhead sleeve has two sections with different diameters and the cooling tube further comprises a transition tube from one diameter section to the other diameter section.

15. An MRI magnet system in accordance with claim 11 wherein the cooling tube is spiral wound around an outside surface of the coldhead sleeve.

16. An MRI magnet system in accordance with claim 11 wherein the first gas passageway is configured to receive exhaust helium gas from the vessel boiled off during a power off condition of the coldhead sleeve.

17. A method for cooling a coldhead sleeve of a magnetic resonance imaging (MRI) magnet system, the method comprising:
    transferring exhaust helium gas from a helium vessel of the MRI magnet system to the coldhead sleeve;
    circulating the helium gas around an outside surface of the coldhead sleeve through a cooling tube extending along substantially an entirety of an axial length of the coldhead sleeve, wherein at least some of the helium gas is recirculated from the cooling tube to a recondensor configured to recondense the exhaust helium gas; and
    removing heat from the coldhead sleeve using the circulated helium gas.

* * * * *